United States Patent

[11] 3,582,809

[72] Inventor Graham Austin Rigby
Albany, Calif.
[21] Appl. No. 758,040
[22] Filed Sept. 6, 1968
[45] Patented June 1, 1971
[73] Assignee Signetics Corporation
Sunnyvale, Calif.

[54] PHASED LOCKED LOOP WITH VOLTAGE CONTROLLED OSCILLATOR
9 Claims, 9 Drawing Figs.

[52] U.S. Cl. .......... 331/8, 331/113
[51] Int. Cl. .......... H03b 3/04
[50] Field of Search .......... 331/8, 113, 144

[56] References Cited
UNITED STATES PATENTS
3,249,893 5/1966 Castellano, Jr. .............. 331/8

*Primary Examiner*—John Kominski
*Attorney*—Flehr, Hohbach, Test, Albritton and Herbert

ABSTRACT: Phase locked loop having a voltage controlled oscillator, a phase comparator and filtering means all of which are integrated into a single monolithic block. The comparator is of The balanced bipolar analog multiplier type and is supplied a control voltage by a multivibrator of the voltage controlled oscillator. The collector load of the multivibrator is provided by the diode drops of the comparator's transistors. The multivibrator is driven by a differential current divider which in turn is provided current by a constant common current source.

INVENTOR.
GRAHAM A. RIGBY
BY Flehr, Hohbach, Test, Albritton & Herbert
ATTORNEYS INVENTOR.
GRAHAM A. RIGBY
BY Flehr, Hohbach, Test, Albritton & Herbert
ATTORNEYS INVENTOR.
GRAHAM A. RIGBY
BY Flehr, Hohbach, Test, Albritton & Herbert
ATTORNEYS INVENTOR.
GRAHAM A. RIGBY
BY Flehr, Hohbach, Test, Albritton & Herbert
ATTORNEYS INVENTOR.
GRAHAM A. RIGBY
BY Flehr, Hohbach, Test, Albritton & Herbert
ATTORNEYS

PHASED LOCKED LOOP WITH VOLTAGE CONTROLLED OSCILLATOR

BACKGROUND OF THE INVENTION

The present invention is directed to phase locked loop with voltage controlled oscillator.

In designing a circuit which is suitable for integration in a semiconductive substrate, the circuit components must be susceptible of compatible processing, and the circuit itself should be simple. With present integration technology the range of value of passive components is limited. Also, any complexity in the power supply requirements of the integrated circuit either in number of supplies or types adds greatly to the cost of the circuit and reduces its reliability.

The packing density of the circuit necessarily aggravates coupling problems and may produce unwanted spurious signals. Lastly, the temperature sensitivity of an integrated circuit produces drift or DC instability.

SUMMARY OF THE INVENTION AND OBJECTS

The phase locked loop includes a voltage controlled oscillator which comprises multivibrator means including first and second transistors. The first and second transistors have collector loads in the form of diodes which maintain the voltage swings at the two collectors of the respective transistors equal and at the forward junction voltage of the diodes. Means is provided for varying the frequency of oscillation of the multivibrator means in response to a frequency control signal. This means includes variable current source means coupled to the emitters of the two transistors with the current source means being responsive to the frequency control signal to vary the amount of current produced by the current source means to thereby vary the output signal of the multivibrator. This output signal has a frequency variation which is linearly proportional to the variation of the current source means. The phase locked loop in addition includes a phase comparator and filtering means.

It is a general object of the invention to provide a phase locked loop with an improved voltage controlled oscillator.

It is another object of the invention to provide a phase locked loop with a voltage controlled oscillator which has a linear variation of output frequency in response to variation of its input frequency control signal.

It is another object of the invention to provide a phase locked loop which is suitable for integration in a semiconductive substrate.

It is another object of the invention to provide a phase locked loop in an integrated circuit which has simplified power supply requirements.

It is another object of the invention to provide a phase locked loop in an integrated circuit which eliminates spurious signals.

It is another object of the invention to provide a phase locked loop in integrated circuit form in which temperature sensitivity is reduced and which thereby promotes DC stability.

DESCRIPTION OF THE PREFERRED EMBODIMENT

Figure 1:
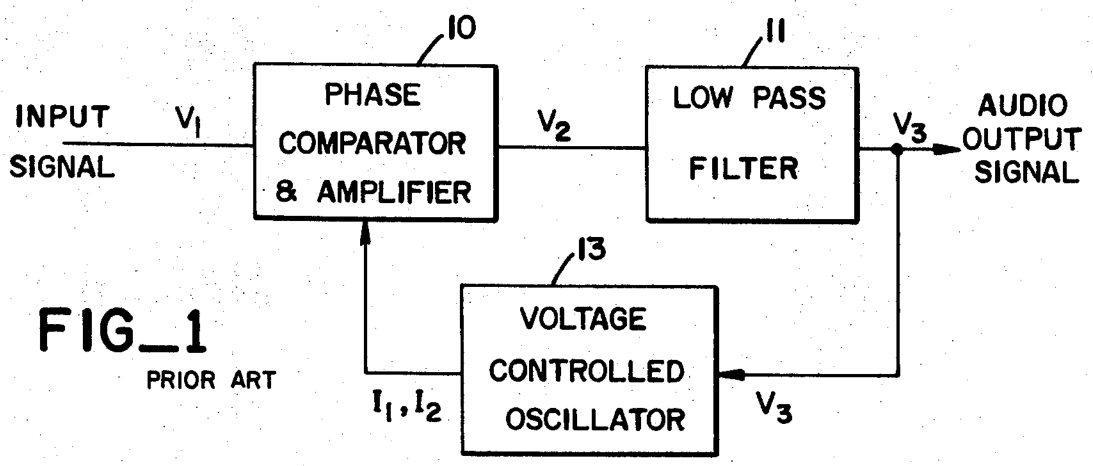
FIG 1 PRIOR ART
FIG. 1 is a block diagram of a phase locked loop.
Figures 3A, 3B, 3C, 3D:
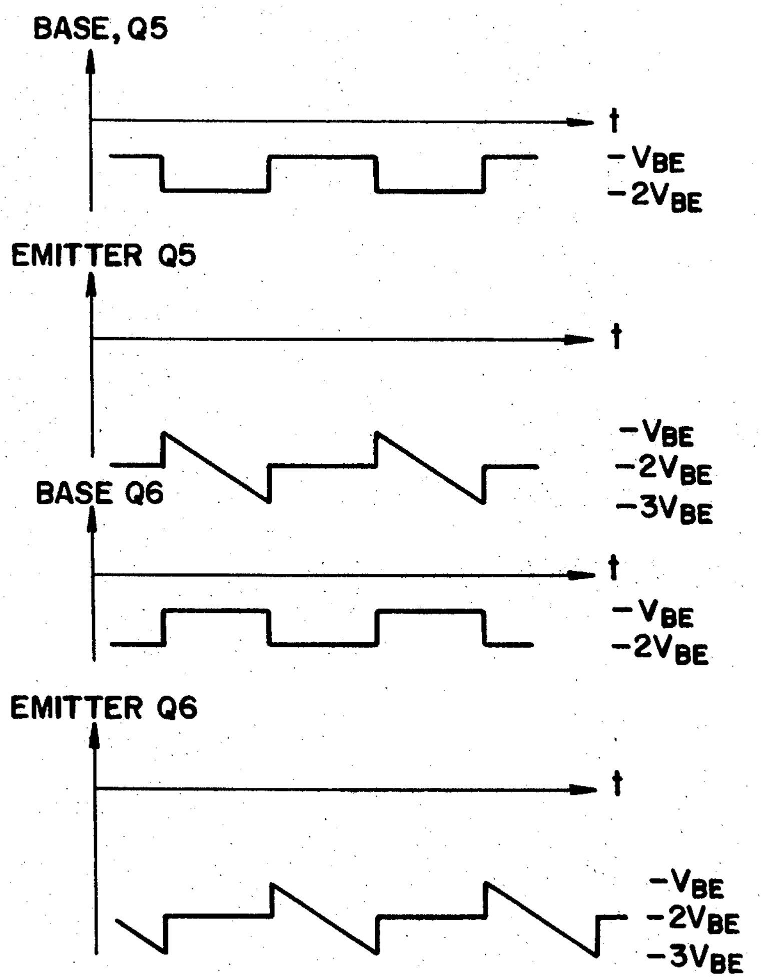
FIGS. 3A through 3D are waveforms at various points in the circuit of FIG. 2 useful in understanding the invention.

The block diagram illustrated in FIG. 1 shows what is termed in the art as a phase locked loop. The loop consists of three basic components: a phase detector or comparator 10 coupled in series to a low pass filter 11 which provides an audio output signal of $V_3$. This output signal is coupled to the input of a voltage controlled oscillator 13 (hereinafter termed VCO) which in turn has an output designated $I_1$, $I_2$ having a frequency which is related to the magnitude of the input voltage $V_3$ of the oscillator.

Phase comparator 10 compares the phase of the periodic input signal, $V_1$, against the phase of the output signal of VCO 13. The output voltage, $V_2$, of phase comparator and amplifier 10 is a measure of the phase difference between the two signals. When the two signals, $V_1$ and $I_1$, $I_2$, being compared have the same frequency, then the error voltage $V_2$ is proportional to the phase difference between the two inputs. In this mode, the system is referred to as being "locked." Such a system is more fully described in a copending application in the names of Hans R. Camenzind and Alan B. Grebene filed July 29, 1968, Ser. No. 748,349 entitled "Integrated Frequency Selective Circuit and Demodulator" and assigned to the present assignee.

The present invention finds particular use in an FM demodulation system where the input signal $V_1$ would be the frequency modulated signal and the output signal $V_3$ would be the audio envelope of the input signal. This is because the phase locked loop by its very nature tracks the variations in the frequency of the input signal. The low pass filter 11 provides for a frequency selective circuit by filtering out or rejecting signals outside of a predetermined frequency range. Such outside frequencies would normally produce a The high frequency error voltage, $V_{,2}$, which would be rejected by the filter.

Figure 2:
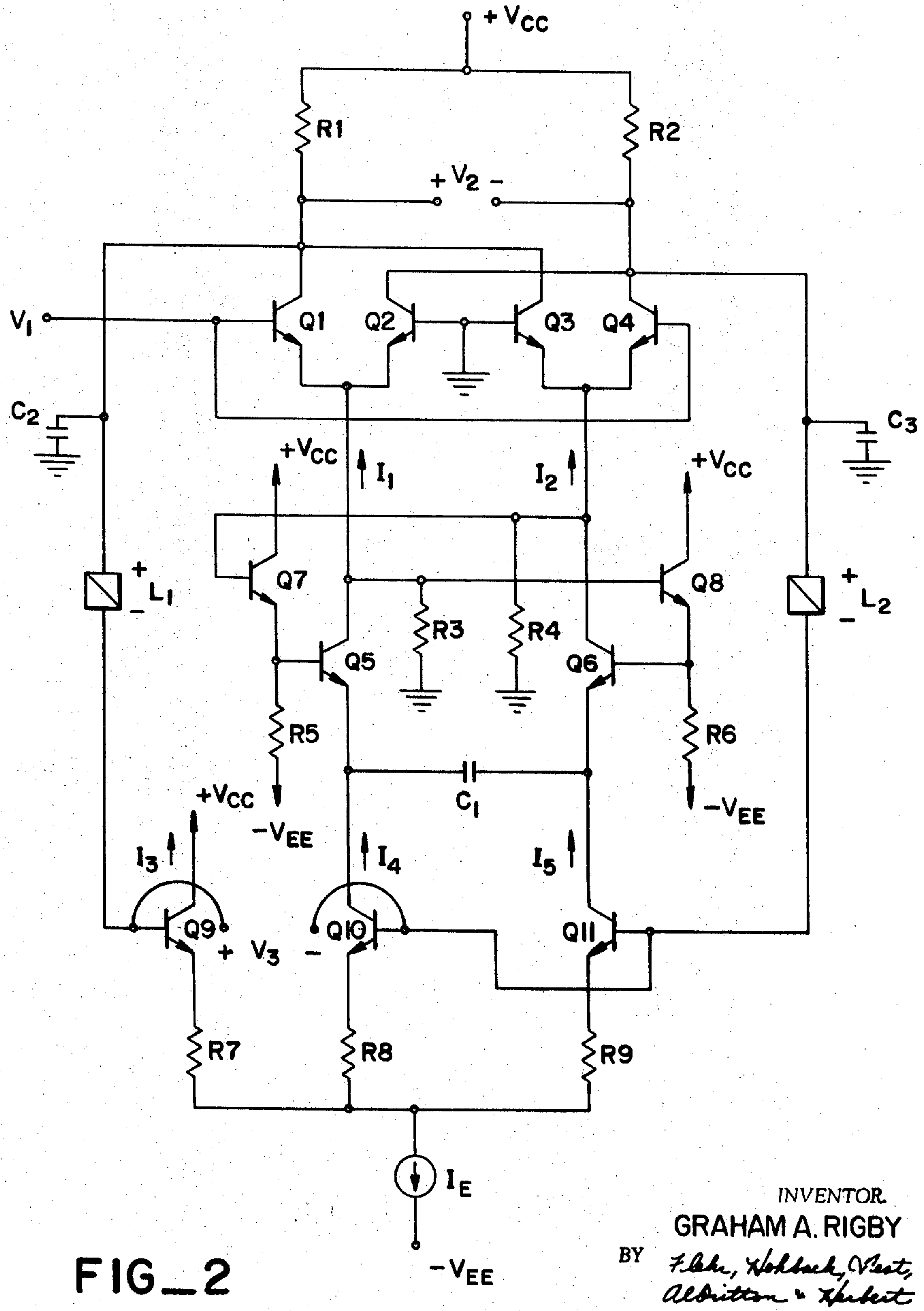
FIG. 2 is simplified schematic diagram of said phase locked loop of FIG. 1; dif nto node 28 as the signal

Referring now to FIG. 2, this is a circuit schematic of the block diagram of FIG. 1. The circuit basically includes 11 transistors numbered Q1 through Q11 which correspond to the three basic blocks of FIG. 1. More specifically, transistors Q1 through Q4 form a phase comparator and amplifier 10 which is in effect a doubly balanced bipolar analog multiplier. Transistors Q5 through Q8 form a voltage controlled oscillator 13 and transistors Q9 through Q11 the control circuit for the VCO 13. Filter 11 consists of capacitor component C2, C3 and resistors R1 and R2.

The circuit for comparator 10 is described in greater detail in an article by A. Bilotti, "Applications of a Monolithic Analog Multiplier" *ISSCC Digest of Tech. Papers*, pp. 116—117, Feb., 1968. The double balancing aspect of phase comparator circuit Q1—Q4 consists, of course, of the first balanced pair Q2, Q3 and a second balanced pair Q1, Q4. The complementary input signals $I_1$ and $I_2$ from VCO 13 are applied respectively to the tied emitters of Q1, Q2, Q3 and Q4. The first level of balancing cancels out any DC offset bias and also any output signal, designated $V_2$, which might appear on the input signal, $V_1$, to the circuit. The second level of balancing removes the product of the cycle. signal and DC bias. The circuit itself operates in accordance Papers,the following equation:

$$V_2 = {}_1V_1(I_1 - I_2) \quad (1)$$

where $V_1$ and $V_2$ correspond to the voltages as illustrated in FIG. 1, $K_1$ is an involved constant which is related to the circuit parameters and the frequency of operation and $I_1$ and $I_2$ are the above-mentioned complementary input signals to the comparator from VCO 13.

The collectors of Q1—Q4 are coupled to a positive voltage supply source $+V_{cc}$ through series resistors R1 and R2. The two pairs of emitters of Q1—Q4 are driven differentially by the output currents $I_1$, $I_2$ of emitter coupled multivibrator Q5—Q8. The multivibrator serves as the essential component of VCO 13. Transistors Q5 and Q6 supply currents $I_1$ and $I_2$ respectively which have a frequency which varies in accordance with the voltage, $V_2$, as will be explained below. Q7 and Q8 serve as the cross coupling elements of the multivibrator and are connected as emitter followers. Capacitor $C_1$ determines the frequency of oscillation. As thus far described, the multivibrator Q5—Q8 is typical of an astable emitter coupled multivibrator as, for example, shown in Millman and Taub, "Pulse, Digital, and Switching Waveforms," McGraw-Hill, New York, 1965, pp. 445—49. However, whereas in a conventional version of a multivibrator as illustrated in the Millman and Taub book, there are normally resistance loads at the collectors of Q5 and Q6, in the present invention they are replaced by the transistors Q1—Q4 which serve as effective diodes for the multivibrator. More specifically, the emitter to base junction of the transistors forms a diode which will maintain the voltage swings at the two collectors of Q5 and Q6 at a voltage equal to the forward emitter base junction voltage ($V_{BE}$) for any collector current greater than $V_{BE}$/R3, where R3 equals R4. The purpose of R3 and R4 is to insure a rapid reverse recovery of the diodes Q1—Q4 when the collector current is switched off.

Thus, the present invention provides a multivibrator circuit in which, by the use of diodes as collector loads nonlinearity and changes in frequency and amplitude are stabilized due to the constant emitter base junction voltage formed by transistors Q1—Q4. Moreover, the simplicity is enhanced since the transistors of the comparator circuit thus serve a double use.

The various waveforms of the multivibrator circuit are shown in FIGS. 3A through 3D and are taken from that point in the circuit as indicated. The magnitude of the various waveforms is given in terms of the base emitter diode drop across transistors Q1 through Q4. From these waveforms it may be shown that the frequency of operation of multivibrator or VCO of Q5—Q8 is:

$$f_0 \approx \frac{I_4+I^5}{2C_1V_{BE}} \quad (2)$$

where $I_4$ equals $I_5$ which are emitters currents of Q5 and Q6 respectively. It is apparent from inspection from equation (2) that the output frequency of the signal, $I_1$, $I_2$, is a linear function of the magnitude of the input currents $I_4$ $I_5$. In contrast, in a conventional multivibrator where instead of the use of diodes in the collector load a resistance is used, the frequency of operation would be determined by:

$$f_0 \approx \frac{I_4I_5}{(I_4+I_5)^2R3C_1} \quad (3)$$

which does not give a linear control characteristic.

Current source means for providing the currents $I_4$ and $I_5$ for varying the frequency of oscillation of the multivibrator include transistors Q9—Q11 which form a current source divider having three legs with series connected emitter resistors are R7, R8 and R9. There are coupled to a common constant current source designated $I_E$ which is terminated at a negative voltage potential /$-V_{EE}$.

In order provide temperature stabilization or minimize DC drift, the value of resistor R8 is equal to R9, and both have resistances twice the magnitude of R7. Thus, $$I_E=I_3+I_4+I_5 \quad (4)$$

and $$I_4=I_5 \quad (5)$$

Thus, it is apparent from equation (4) that to maintain $I_E$ constant an increase in the values of $I_4$ and $I_5$ necessarily mean a decrease in the value of $I_3$.

A feedback path for providing a frequency control signal $V_3$ which thereby closes the phase locked loop is provided by DC level shift blocks L1 and L2. These maybe, as will be illustrated in FIG. 4, PNP transistors or NPN emitter followers driving resistive dividers.

Coupled in parallel to the feedback loop are capacitors $C_2$ and $C_3$ which in combination with resistors R1 and R2 provide the filtering means of the phase locked loop.

Referring again to the current source divider Q9—Q11 it may be shown by simple analysis that $$I_5=\frac{I_E}{4}-\frac{V_3}{2R7+R9} \quad (6)$$

where $V_3$ is the output voltage of the phase locked loop which is applied in one polarity sense to the base of transistor Q9 and in the opposite polarity sense to the tied bases of transistors Q10 and Q11. Substitution of equation (6) into equation (2) yields $$f_0=\frac{1}{2C_1V_{BE}}\left[\frac{I_E}{2}-\frac{V_3}{R7+R9/2}\right] \quad (7)$$

From phase locked loop theory it may be shown that the locking range of this phase locked loop is:

$$\Delta f=\frac{K_1V_1K_2}{2C_1V_{BE}(R7+R9/2)} \quad (8)$$

where $K_2$ equals $V_3/V_2$ which is the DC gain of the level of shift blocks L1, L2. For FM demodulation purposes the information output may be taken as $V_2$, giving a demodulation gain of $$\frac{V_2}{\Delta f}=\frac{2C_1V_{BE}(R7+R9/2)}{K_2} \quad (9)$$

From examination of the circuit of FIG. 2, it is apparent that the transistors are all connected in cascade; that is, the emitters of transistors Q1—Q4 are coupled to the collectors of transistors Q5, Q6, and in turn the emitters of these transistors are coupled to the collectors of transistors Q10 and Q11. Such cascade connection enables a common power source $V_{cc}$ to be used and a common current supply and bias system to be utilized for both the comparator Q1—Q4 and the multivibrator Q5—Q8. This provides for economy of circuit design and a minimization of possible circuit malfunctions. The differential current arrangement provided by transistors Q9—Q11 stabilizes the temperature characteristics of the circuit, especially if integrated, since the variation of current in one direction in one portion of the circuit will be counteracted by an opposite variation in another portion. Moreover, $I_E$ serves as a common current source for the transistors of the current.

Figure 4:
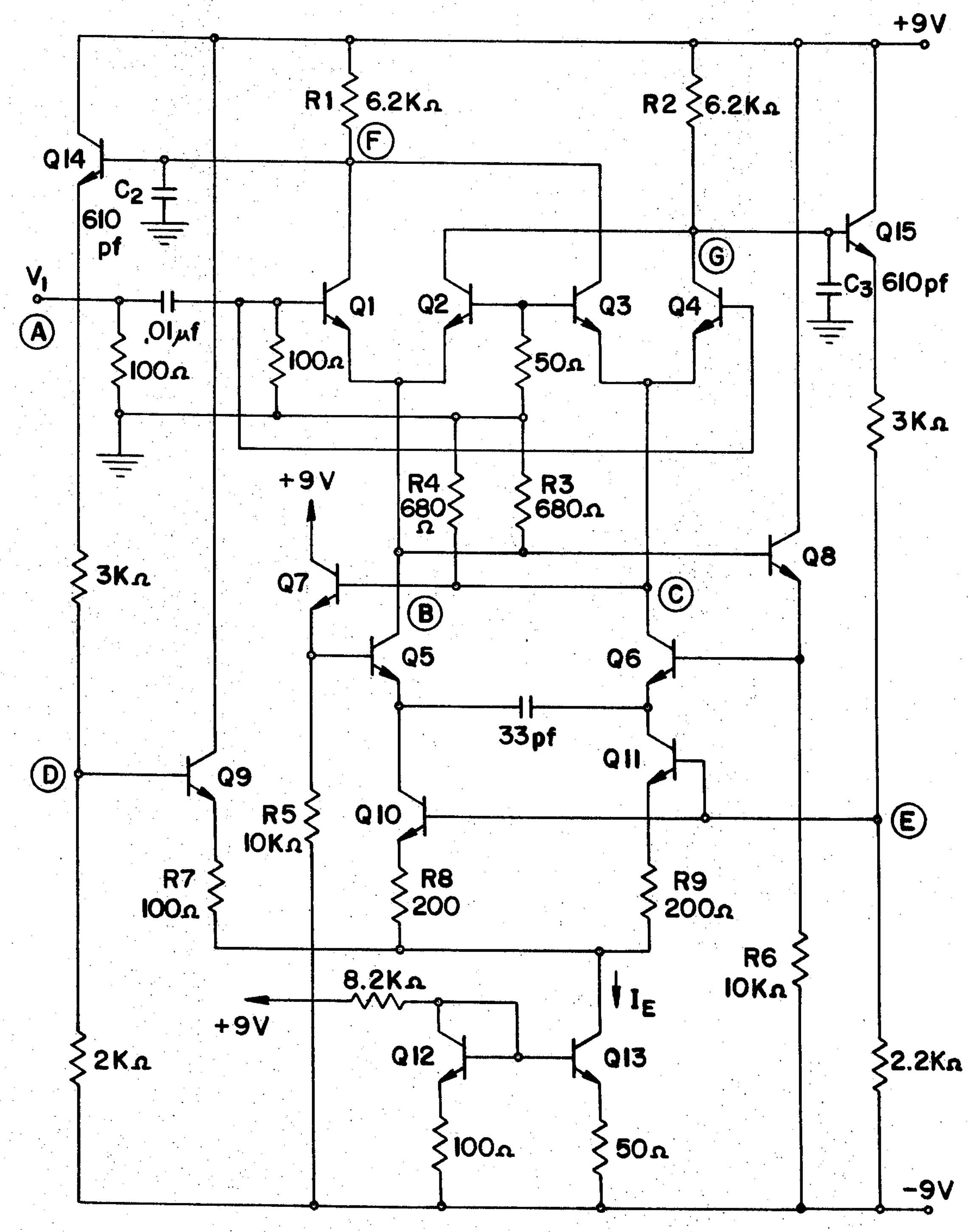
FIG. 4 is an actual circuit schematic, which is similar but more detailed to the schematic of FIG. 3, which is suitable for integration.

FIG. 4 shows a more detailed circuit schematic with the appropriate values of the components being indicated. The output of the circuit is taken from lettered points D and E. "A" is the input, $V_1$, and B and C the currents $I_1$ $I_2$. The voltage across F and G is $V_2$. The circuit of FIG. 4 was tested and exhibited the following performance data:

1. VCO control factor: 20 kHz./mV with respect to output voltage $V_3$.

2. Locking range at 10 Mhz., for an input voltage of 1 mV RMS: 480 kH(±240 kHz.

Listening tests were conducted on this circuit and the quality of the audio output was judged to be high.

The circuit of FIG. 4 includes the additional elements, as compared to FIG. 3, of transistors Q12 and Q13 which form the current source for $I_E$ and the DC shift level blocks of L1 and L2 include transistors Q14 and Q15 and their associated resistors.

Figure 5:
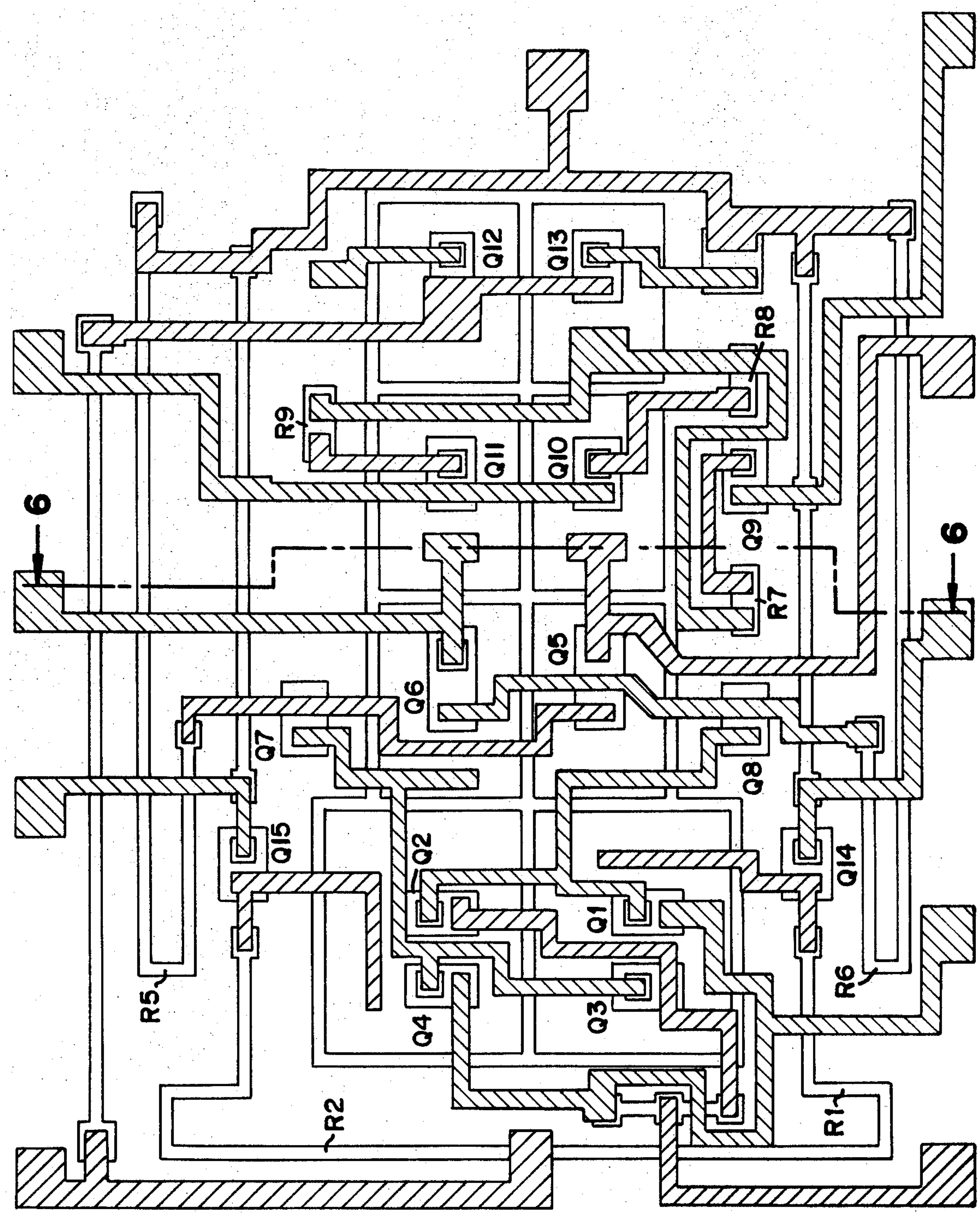
FIG. 5 is an elevation view of an integrated circuit which is an integration of a circuit of FIG. 4.
Figure 6:
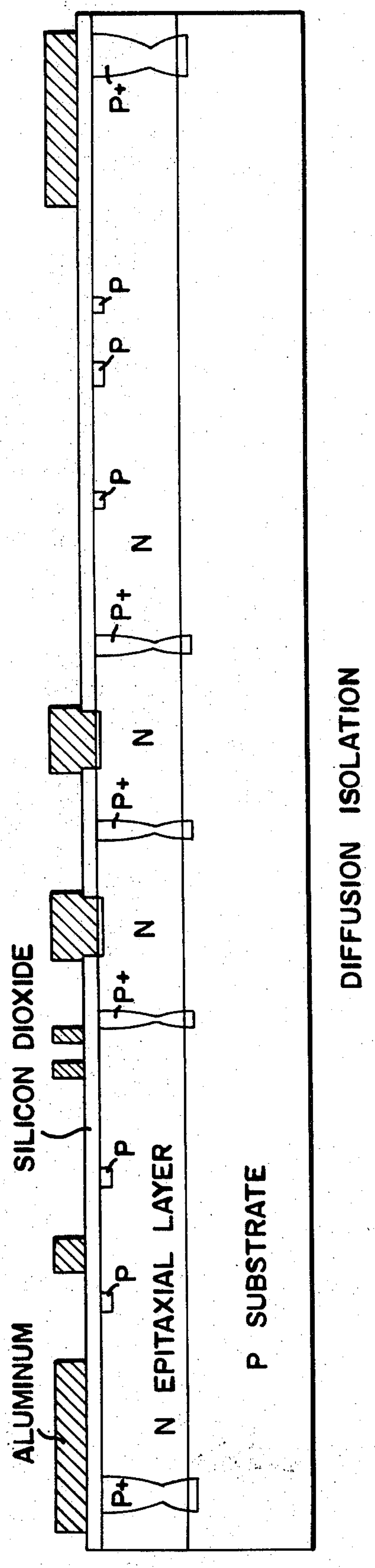
FIG. 6 is a typical cross-sectional view taken along the line 6–6 of FIG. 5.

The circuit of FIG. 4 in integrated form i.e., in a single monolithic block, is shown in FIG. 5 where like references designate corresponding integrated components. The integrated circuit, as best illustrated in FIG. 6, is made by diffusion isolation technique where the P+ legs provide isolation. Details of such integration are also described in the above-mentioned Camenzind copending application.

Thus, the present invention has provided a phase locked loop with an improved voltage controlled oscillator which is suitable for integration and provides for simplified and reliable circuitry and circuit stability.

I claim:

1. In a phase locked loop, a phase comparator for receiving the input signal and providing an output, filtering means coupled to the output of the phase comparator and providing a filtered output serving as a frequency control signal and a voltage controlled oscillator coupled between the output of the filtering means and the phase comparator, said voltage controlled oscillator comprising multivibrator means including first and second transistors, each having a base, collector and emitter, diode means connected to the collector of said first and second transistors for maintaining the voltage swings at the collectors of said first and second transistors equal and at the forward junction voltage of said diode means and means for varying the frequency of oscillation of said multivibrator means in response to said frequency control signal including variable current source means coupled to the emitters of said first and second transistors said current source means being responsive to said frequency control signal to vary the amount of current produced by said current source means to vary the output signal of the multivibrator means said phase comparator including at least two transistors, said comparator comparing the phase of the output signal of the multivibrator with the input signal for providing a difference signal indicative of the phase difference between such signals, said two transistors of said phase comparator also serving as said diode means of said multivibrator, said filtering means filtering said difference signal and providing said frequency control signal which is applied to said current source means, whereby the frequency of the output signal of said multivibrator is identical to the frequency of said input signal.

2. A phase locked loop as in claim 1 wherein said transistors of said multivibrator and said phase comparator are cascade connected together with a common biasing means for supplying biasing voltage to said transistors of said multivibrator and said phase comparator.

3. A phase locked loop as in claim 2 in which said transistors of said voltage controlled oscillator and said phase comparator are fed from a common current supply.

4. A phase locked loop as in claim 1 in which the transistor pairs of said multivibrator and said phase comparator form a balanced circuit for eliminating spurious signals.

5. A phase locked loop as in claim 1 in which said phase comparator includes two additional transistors for producing a doubly balanced circuit system, said additional two transistors being coupled to said first-named two transistors to form a bipolar analog multiplier to doubly balance said system cancelling out DC offset bias and any product of the input signal with said DC bias which exists in such circuit.

6. A phase locked loop as in claim 1 together with a semiconductive substrate in which the substantial majority of the components of the phase comparator and the voltage controlled oscillator are integrated.

7. In a phase locked loop, a phase comparator for receiving the input signal and providing an output, filtering means coupled to the output of the phase comparator and providing a filtered output serving as a frequency control signal and a voltage controlled oscillator coupled between the output of the filtering means and the phase comparator, said voltage controlled oscillator comprising multivibrator means including first and second transistors each having a base, collector and emitter, diode means connected to the collector of said first and second transistors for maintaining the voltage swings at the collectors of said first and second transistors equal and at the forward junction voltage of said diode means and means for varying the frequency of oscillation of said multivibrator means in response to said frequency control signal including variable current source means coupled to the emitters of said first and second transistors, said current source means being responsive to said frequency control signal to vary the amount of current produced by said current source means to vary the output signal of the multivibrator whereby said output signal has a frequency variation which is linearly proportional to said variation of said current source means said current source means including a common constant current source coupled to a current divider network having three legs, two of the legs being coupled to said emitters of said transistors of said multivibrator and a third leg carrying the remainder of the current of said common constant current source, and said current source means also including means responsive to said frequency control signal coupled to said three legs of said current divider network for varying the current in said two legs coupled to said emitters of said multivibrator transistors in an opposite sense relative to said variation of current in said third leg in response to said variation in the magnitude of said frequency control signal whereby said common current source is maintained constant and said differential variation of currents of said legs stabilizes the temperature characteristics of said current source means.

8. A phase locked loop as in claim 7 wherein the means for varying said currents in said legs includes a transistor in each of said legs, said frequency control signal being applied between the base of the transistor of said third leg and the tied bases of the transistors of said first and second legs whereby the voltage mode of said frequency control signal is converted to a current mode signal.

9. In a phase locked loop, a phase comparator for receiving the input signal and providing an output, filtering means coupled to the output of the phase comparator and providing a filtered output serving as a frequency control signal and a voltage controlled oscillator coupled between the output of the filtering means and the phase comparator, said voltage controlled oscillator comprising multivibrator means including first and second transistors each having a base, collector and emitter, means connected to the collector of said first and second transistors for maintaining the voltage swings at the collectors of said first and second transistors equal and independent of the current level of said transistors and means for varying the frequency of oscillation of said multivibrator means in response to said frequency control signal including variable current source means coupled to the emitters of said first and second transistors, said current source means being responsive to said frequency control signal to vary the amount of current produced by said current source means to vary the output signal of the multivibrator whereby said output signal has a frequency variation which is linearly proportional to said variation of said current source means, said current source means including a common constant current source coupled to a current divider network having three legs, two of the legs being coupled to said emitters of said transistors of said multivibrator and a third leg carrying the remainder of the current of said common constant current source, and said current source means also including means responsive to said frequency control signal coupled to said three legs of said current divider network for varying the current in said two legs coupled to said emitters of said multivibrator transistors in an opposite sense relative to said variation of current in said third leg in response to said variation in the magnitude of said frequency control signal whereby said common current source is maintained constant and said differential variation of currents of said legs stabilizes the temperature characteristics of said current source means.